United States Patent
Nakabayashi et al.

(10) Patent No.: US 7,622,777 B2
(45) Date of Patent: Nov. 24, 2009

(54) SEMICONDUCTOR DEVICE AND METHOD FOR FABRICATING THE SAME

(75) Inventors: Takashi Nakabayashi, Toyama (JP); Hideyuki Arai, Toyama (JP); Mitsuo Nissa, Toyama (JP)

(73) Assignee: Panasonic Corporation, Osaka (JP)

( * ) Notice: Subject to any disclaimer, the term of this patent is extended or adjusted under 35 U.S.C. 154(b) by 452 days.

(21) Appl. No.: 11/544,653

(22) Filed: Oct. 10, 2006

(65) Prior Publication Data

US 2007/0138571 A1 Jun. 21, 2007

(30) Foreign Application Priority Data

Dec. 6, 2005 (JP) .............................. 2005-352177

(51) Int. Cl.
*H01L 27/088* (2006.01)
(52) U.S. Cl. .............. 257/365; 257/206; 257/391; 257/E29.263; 257/E21.443; 257/E21.618; 438/276

(58) Field of Classification Search ............... 257/206, 257/365, 376, 392, 391, E29.263, E21.443, 257/E21.618, E21.633; 438/276, 275, 278
See application file for complete search history.

(56) References Cited

U.S. PATENT DOCUMENTS 6,143,594 A * 11/2000 Tsao et al. ................ 438/199

FOREIGN PATENT DOCUMENTS

JP 2003-017582 1/2003

* cited by examiner

*Primary Examiner*—Julio J Maldonado
(74) *Attorney, Agent, or Firm*—McDermott Will & Emery LLP

(57) ABSTRACT

A threshold control layer of a second MIS transistor is formed under the same conditions for forming a threshold control layer of a first MIS transistor. LLD regions of the second MIS transistor are formed under the same conditions for forming LDD regions of a third transistor.

35 Claims, 7 Drawing Sheets

SEMICONDUCTOR DEVICE AND METHOD FOR FABRICATING THE SAME

BACKGROUND OF THE INVENTION

The present invention relates to a semiconductor device and a method for fabricating the semiconductor device, and more particularly relates to a system LSI in which a DRAM is mounted and a method for fabricating the system LSI.

In recent years, there has been an increased demand for high speed processing of a large amount of data such as an image. With an increased data bus width between a memory and a logic in a DRAM embedded LSI in which a DRAM is mounted, the DRAM can perform high speed date processing of a large amount of data. Furthermore, in a DRAM embedded LSI, unlike the case where a memory is externally provided, load-carrying capacitance, load resistance and the like which exist between packages are very small and thus reduction in power consumption is possible. Therefore, it is expected that DRAM embedded LSIs become a solution to the above-described demand.

DRAM embedded LSIs are used for consumer electric appliances centered around AV systems and reduction in cost is highly demanded. Accordingly, how to reduce the area of on-board DRAMs has become a big issue.

FIG. 6 is a plan view illustrating a typical DRAM embedded LSI chip (see, for example, Japanese Laid-Open Publication No. 2003-17582). As shown in FIG. 6, on the DRAM embedded LSI chip, a logic circuit region 101, an analogue circuit region 102, a DRAM core region 103 and an I/O (IN/OUT) circuit region 104 are arranged over a semiconductor substrate 100. In the DRAM core region 103, a control region 105, memory cell array regions 106, sense amplifier regions 107 and a word driver region 108 are arranged. Bonding pad regions 109 are formed in a region of the semiconductor substrate 100 which surrounds the regions 101 through 104, i.e., a peripheral portion of the semiconductor substrate 100. A plurality of MIS transistors having various different driving powers are formed in the regions shown in FIG. 6, respectively.

FIG. 7 is a circuit diagram illustrating a circuit configuration of a typical sense amplifier region in a DRAM embedded LSI. FIG. 7 illustrates a circuit configuration of for the sense amplifier regions 107 in the DRAM embedded LSI of FIG. 6. Although not shown in FIG. 7, the memory cell array regions 106 of FIG. 6 are arranged in both sides of each of the sense amplifier regions 107, respectively.

Each of the sense amplifier regions 107 includes a sense amplifier CIR2 for amplifying a voltage difference between pair bit lines (BITL and XBITL), a switch CIR3 for taking out data from a bit line and a precharge transistor region CIR1.

In the precharge transistor region CIR1, precharge transistors Tr11 and Tr12 for setting the pair bit lines to a precharge potential and an equalizing transistor Tr13 for smoothing a potential between the pair bit lines are arranged. Shared switch transistors Tr14 and Tr15 are arranged so that the shared switch transistors Tr14 and Tr15 are located on the pair bit lines, respectively, between the equalizing transistor Tr13 and the sense amplifier CIR2. By turning ON/OFF the shared switch transistors Tr14 and Tr15, a single sense amplifier CIR2 can be shared by memories arranged on the left and right of the sense amplifier CIR2.

FIG. 8 is a cross-sectional view illustrating respective structures of MIS transistors formed in the regions of FIG. 6 and FIG. 7, respectively. As shown in FIG. 8, for example, an I/O transistor (INPUT/OUTPUT transistor) Tr1, a shared switch transistor Tr2 and a logic transistor Tr3 are formed on the semiconductor substrate 100. The I/O transistor Tr1 is a transistor formed in the I/O circuit region 104 of FIG. 6. The shared switch transistor Tr2 is a transistor formed in each of the sense amplifier regions 107 shown in FIG. 6 and FIG. 7. The logic transistor Tr3 is a transistor formed in the logic circuit region 101, the control region 105 and the like.

The transistors Tr1, Tr2 and Tr3 include gate insulating films 121, 131 and 141, respectively, gate electrodes 122, 132 and 142, respectively, sidewalls 123, 133 and 143, respectively, LDD (lightly doped drain structure) regions 124, 134 and 144, respectively, source/drain regions 125, 135 and 145, respectively, and threshold control layers 126, 136 and 146, respectively.

A thickness of the gate insulating film 131 of the shared switch transistor Tr2 is smaller than a thickness of the gate insulating film 121 of the I/O transistor Tr1 and larger than a thickness of the gate insulating film 141 of the logic transistor Tr3.

The threshold control layer 126 of the I/O transistor Tr1 and the threshold control layer 136 of the shared switch transistor Tr2 are formed by the same ion implantation so as to have the same impurity concentration profile. An impurity concentration of each of the threshold control layer 126 and the threshold control layer 136 is lower than an impurity concentration of the threshold control layer 146 of the logic transistor Tr3.

The LDD region 124 of the I/O transistor Tr1 and the LDD region 134 of the shared switch transistor Tr2 are formed by the same ion implantation so as to have the same impurity concentration profile. A junction depth of each of the LDD regions 124 and 134 is larger than a junction depth of the LDD region 144 of the logic transistor Tr3.

SUMMARY OF THE INVENTION

With the configuration of a known semiconductor device shown in FIG. 8, the following problems arise.

A larger voltage is applied to the gate electrode 132 of the shared switch transistor Tr2 than to the gate electrode 142 of the logic transistor Tr3. Thus, the gate insulating film 131 of the shared switch transistor Tr2 is formed so as to have a larger thickness than a thickness of the gate insulating film 141 of the logic transistor Tr3. The LDD regions 134 and the threshold control layer 136 of the shared switch transistor Tr2 are formed so as to have the same impurity concentration profile as the impurity concentration profile in the LDD regions 124 and the threshold control layer 126 of the I/O transistor Tr1.

In the known shared switch transistor Tr2 having the above-described configuration, when a gate length is reduced, a short channel effect occurs.

FIG. 9 is a graph showing the dependency of threshold voltage (Vt) on gate length (Lg) for the known MIS transistor. Results shown in FIG. 9 were obtained through consideration and measurement by the present inventors. As shown in FIG. 9, in the configuration of the shared switch transistor Tr2, when a gate length is 0.4 μm or less, a threshold voltage is reduced. Accordingly, in the known configuration, to prevent the short channel effect, the gate length of the shared switch transistor Tr2 has to be the same as a gate length of the I/O transistor Tr1 (i.e., 0.4 μm).

For this reason, in a sense amplifier portion using the known shared switch transistor Tr2, reduction in area can not be achieved.

In view of the above-described problem, the present invention has been devised and it is therefore an object of the present invention to provide a semiconductor device which allows reduction in area and a method for fabricating such a semiconductor device.

A semiconductor device according to a first aspect of the present invention includes: a first MIS transistor formed in a first region of a semiconductor substrate; a second MIS transistor formed in a second region of the semiconductor substrate; and a third MIS transistor formed in a third region of the semiconductor substrate. In the semiconductor of the first aspect, the first MIS transistor includes a first gate insulating film formed on the first region, a first gate electrode formed on the first gate insulating film, a first impurity doped layer formed in part of the first region located at each side of the first gate electrode and a first threshold control layer formed in part of the first region located under the first gate electrode, the second MIS transistor includes a second gate insulating film formed on the second region, a second gate electrode formed on the second gate insulating film, a second impurity doped layer formed in part of the second region located at each side of the second gate electrode and a second threshold control layer formed in part of the second region located under the second gate electrode, the third MIS transistor includes a third gate insulating film formed on the third region, a third gate electrode formed on the third gate insulating film, a third impurity doped layer formed in part of the third region located at each side of the third gate electrode and a third threshold control layer formed in part of the third region located under the third gate electrode, a thickness of the second gate insulating film is substantially the same as or smaller than a thickness of the first gate insulating film and is larger than a thickness of the third gate insulating film, the second impurity doped layer has substantially the same impurity concentration profile as an impurity concentration profile of the third impurity doped layer and has a lower impurity concentration than an impurity concentration of the first impurity doped layer, and the second threshold control layer has substantially the same impurity concentration profile as an impurity concentration profile of the first threshold control layer and has a lower impurity concentration than an impurity concentration of the third threshold control layer. Note that a range which "substantially the same" covers includes a difference within a margin of an error which occurs in fabrication process steps.

In the semiconductor device of the first aspect of the present invention, even when a gate length of the second MIS transistor is reduced, reduction in threshold can be prevented. Therefore, reduction in area can be achieved.

In the semiconductor of the first aspect of the present invention, the first MIS transistor may further include first sidewalls on side surfaces of the first gate electrode, respectively, and first source/drain regions formed so that each said first source/drain doped region is located in part of the first region outwardly extending from an associated one of the first sidewalls, the second MIS transistor may further include second sidewalls on side surfaces of the second gate electrode, respectively, and second source/drain regions formed so that each said second source/drain doped region is located in part of the second region outwardly extending from an associated one of the second sidewalls, and the third MIS transistor may further include third sidewalls on side surfaces of the third gate electrode, respectively, and third source/drain regions formed so that each said third source/drain doped region is located in part of the third region outwardly extending from an associated one of the third sidewalls.

In the semiconductor device of the first aspect of the present invention, each of the first impurity doped layer, the second impurity doped layer and the third impurity doped layer may be a LDD region.

In the semiconductor device of the first aspect of the present invention, a junction depth of the first impurity doped layer may be larger than respective junction depths of the second impurity doped layer and the third impurity doped layer.

In the semiconductor device of the first aspect of the present invention, the second impurity doped layer and the third impurity doped layer may be formed by the same ion implantation. In such a case, reduction in area can be achieved without increasing the number of process steps, compared to the known technique.

In the semiconductor device of the first aspect of the present invention, the first threshold control layer and the second threshold control layer may be formed by the same ion implantation. In such a case, reduction in area can be achieved without increasing the number of process steps, compared to the known technique.

The semiconductor device of the first aspect of the present invention may further include: a memory cell; and a sense amplifier, and the second MIS transistor may be a shared switch transistor located between the memory cell and the sense amplifier. As for shared switch transistors, increase in operation speed is not required and a shared switch transistor can be used under the condition where a gate voltage is higher than a drain voltage. Therefore, use of a shared switch transistor as the second MIS transistor is particularly suitable.

The semiconductor device of the first aspect of the present invention may further include: a memory cell; and a sense amplifier, and the second MIS transistor may be a precharge transistor located between the memory cell and the sense amplifier. Since a precharge transistor is formed in a region located close to a shared switch transistor, the precharge transistor and the shared switch transistor can be formed under the same conditions, so that process steps can be simplified.

The semiconductor device of the first aspect of the present invention may further include: a memory cell; and a sense amplifier, and the second MIS transistor may be an equalizing transistor located between the memory cell and the sense amplifier. Since an equalizing transistor is formed in a region close to a shared switch transistor, the equalizing transistor and the shared switch transistor are formed under the same conditions, so that process steps can be simplified.

In the semiconductor device of the first aspect of the present invention, the first MIS transistor may be an input/output transistor.

In the semiconductor device of the first aspect of the present invention, the third MIS transistor may be a logic transistor.

In the semiconductor device of the first aspect of the present invention, a gate length of the second gate electrode may be smaller than a gate length of the first gate electrode and larger than a gate length of the third gate electrode.

A method for fabricating a semiconductor device according to the first aspect of the present invention is a method for fabricating a semiconductor device which includes a first MIS transistor formed in a first region of a semiconductor substrate; a second MIS transistor formed in a second region of the semiconductor substrate; and a third MIS transistor formed in a third region of the semiconductor substrate. The method includes the steps of: a) forming a first threshold control layer in the first region and forming a second threshold control layer in the second region; b) forming, in the third region, a third threshold control layer having a smaller impurity concentration than an impurity concentration of the second threshold control layer; c) forming, after the step a) and the step b), a first gate insulating film on the first region; d) forming, after the step a) and the step b), a second gate insulting film having a thickness that is substantially the same as or smaller than a thickness of the first gate insulating film on the second region; e) forming, after the step a) and the step b), a third insulating film having a smaller thickness than a thickness of the second gate insulating film on the third region; f) forming a first gate electrode on the first gate insulating film, a second gate electrode on the second gate insulating film and a third gate electrode on the third gate insulating film; g) forming a first impurity doped layer in part of the first region located at each side of the first gate electrode; and h) forming a second impurity doped layer in part of the second region located at each side of the second region and forming a third impurity doped layer in part of the third region located at each side of the third gate electrode, and in the step h), an impurity concentration of the second impurity doped layer is made higher than an impurity concentration of the first impurity doped layer.

In a semiconductor device fabricated according to the method of the first aspect of the present invention, even when a gate length of the second MIS transistor is reduced, reduction in threshold can be prevented. Therefore, reduction in area can be achieved. In the step h), the second impurity doped layer is formed simultaneously to formation of the third impurity doped layer and thus the number of process steps is not increased, compared to the known technique.

The method for fabricating a semiconductor device according to the first aspect of the present invention may further include the steps of: i) forming, after the step h), first sidewalls on side surfaces of the first gate electrode, respectively, second sidewalls on side surfaces of the second gate electrode, respectively, and third sidewalls on side surfaces of the third gate electrode, respectively; and j) forming, after the step i), first source/drain regions so that each said first source/drain region is located in part of the first region outwardly extending from an associated one of the first sidewalls, second source/drain regions so that each said second source/drain region is located in part of the second region outwardly extending from an associated one of the second sidewalls, and third source/drain regions so that each said third source/drain region is located in part of the third region outwardly extending from an associated one of the third sidewalls.

In the method for fabricating a semiconductor device according to the first aspect of the present invention, in the step g), the first impurity doped layer may be formed so as to have a larger junction depth than respective junction depths of the second impurity doped layer and the third impurity doped layer.

In the method for fabricating a semiconductor device according to the first aspect of the present invention, in the step f), a gate length of the second gate electrode may be made smaller than a gate length of the first gate electrode and larger than a gate length of the third gate electrode.

DESCRIPTION OF THE PREFERRED EMBODIMENTS

Embodiments

Figure 1:
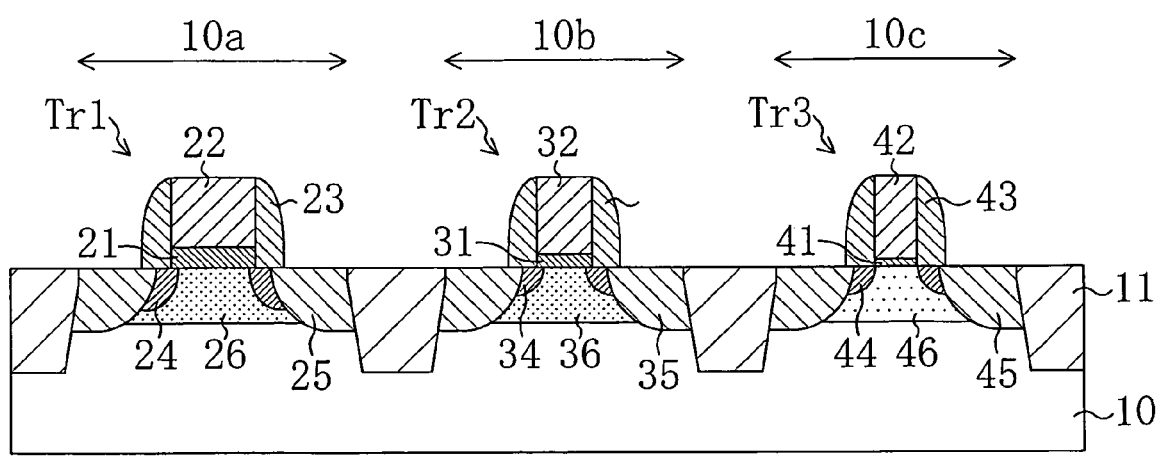
FIG. 1 is a cross-sectional view illustrating a configuration of a semiconductor device according to an embodiment of the present invention.

FIG. 1 is a cross-sectional view illustrating a configuration of a semiconductor device according to an embodiment of the present invention. As shown in FIG. 1, in the semiconductor device according to this embodiment, a first MIS transistor Tr1, a second MIS transistor Tr2 and a third MIS transistor Tr3 are arranged on the p-type semiconductor substrate 10 made of silicon. In the semiconductor substrate 10, a first region 10a, a second region 10b and a third region 10c in which the transistors Tr1, Tr2 and Tr3 are formed, respectively, are separated from one another by an isolation region 11. In FIG. 1, the case where the transistors Tr1, Tr2 and Tr3 are arranged so as to be adjacent to one another with the insulation region 11 interposed therebetween. However, the transistors Tr1, Tr2 and Tr3 are not necessarily arranged to be adjacent to one another. That is, the transistors Tr1, Tr2 and Tr3 may be arranged in regions of the semiconductor substrate 10 so as to be separated away from one another with a distance.

The first MIS transistor Tr1 includes a gate insulating film 21 formed of a silicon oxide film on the first region 10a so as to have a thickness of 8 nm, a gate electrode 22 formed of polysilicon on the gate insulating film 21 so as to have a gate length of 0.6 μm, sidewalls 23 formed on side surfaces of the gate electrode 22, respectively, so that each of the sidewalls 23 has a thickness of 50 nm, n-type LDD regions (impurity doped layer) 24 formed in parts of the first region 10a located at sides of the gate electrode 22, respectively, n-type source/drain doped regions 25 formed so that each of the n-type source/drain doped regions 25 is located in part of the first region 10a outwardly extending from an associated one of the sidewalls 23, and a p-type threshold control layer 26 formed in part of the first region 10a located under the gate electrode 22. The threshold control layer 26 is formed in part (i.e., channel region) of the semiconductor substrate 10 interposed between the LDD regions 24 and between the n-type source/drain doped regions 25. Herein, a "threshold control layer" is a layer formed in part of a semiconductor substrate located under a gate electrode so as to have an opposite conductive type to a conductive type of source/drain regions and LDD regions and have a lower impurity concentration than an impurity concentration of the source/drain regions and the LDD regions. That is, an impurity doped layer satisfying the above-described condition is called "threshold control layer"

whether or not the layer is formed for the purpose of controlling a threshold. The first MIS transistor Tr1 can be used as an I/O transistor.

The second MIS transistor Tr2 includes a gate insulating film 31 formed of a silicon oxide film on the second region 10b so as to have a thickness of 6 nm, a gate electrode 32 formed of polysilicon on the gate insulating film 31 so as to have a gate length of 0.1 µm, sidewalls 33 formed on side surfaces of the gate electrode 32, respectively, so that each of the sidewalls 33 has a thickness of 50 nm, n-type LDD regions 34 formed in parts of the second region 10b located at sides of the gate electrode 32, respectively, n-type source/drain doped regions 35 formed so that each of the n-type source/drain doped regions 35 is located in part of the second region 10b outwardly extending from an associated one of the sidewalls 33, and a p-type threshold control layer 36 formed in part of the second region 10b located under the gate electrode 32. The threshold control layer 36 is formed in part (i.e., channel region) of the semiconductor substrate 10 interposed between the LDD regions 34 and between the source/drain doped regions 35. The gate insulating film 31 may have the same thickness as the thickness of the gate insulating film 21. The second MIS transistor Tr2 may be used as a shared switch transistor.

The third MIS transistor Tr3 includes a gate insulating film 41 formed of a silicon oxide film on the third region 10c so as to have a thickness of 2 nm, a gate electrode 42 formed of polysilicon on the gate insulating film 41 so as to have a gate length of 0.06 µm, sidewalls 43 formed on side surfaces of the gate electrode 42, respectively, so that each of the sidewalls 43 has a thickness of 50 nm, n-type LDD regions 44 formed in parts of the third region 10c located at sides of the gate electrode 42, respectively, n-type source/drain doped regions 45 formed so that each of the n-type source/drain doped regions 45 is located in part of the third region 10c outwardly extending from an associated one of the sidewalls 43, and a p-type threshold control layer 46 formed in part of the third region 10c located under the gate electrode 42. The threshold control layer 46 is formed in part (i.e., channel region) of the semiconductor substrate 10 interposed between the LDD regions 44 and between the source/drain doped regions 45. The third MIS transistor Tr3 can be used as a logic transistor.

The LDD regions 34 is substantially the same impurity concentration profile as an impurity concentration profile of the LDD regions 44 and an impurity concentration in the LDD regions 34 is lower than an impurity concentration in the LDD regions 24. A junction depth of the LDD regions 24 is larger than respective junction depths of the LDD regions 34 and the LDD regions 44. The threshold control layer 36 is formed so as to have substantially the same impurity concentration profile as an impurity concentration profile of the threshold control layer 26 and a lower impurity concentration than an impurity concentration in the LDD regions 46. The sidewalls 23, 33 and 43 may be formed of a silicon nitride film, a silicon oxide film or a laminated film of a silicon nitride film and a silicon oxide film.

Next, a method for operating each of the transistors Tr1, Tr2 and Tr3 of this embodiment will be described.

The first MIS transistor Tr1 is operated by application of a gate voltage of 3.3 V to the gate electrode 22 and application of a drain voltage of 3.3 V to the source/drain doped regions 25. The second MIS transistor Tr2 is operated by application of a gate voltage of 2.5 V to the gate electrode 32 and application of a drain voltage of 1.2 V to the source/drain doped regions 35. The third MIS transistor Tr3 is operated by application of a gate voltage of 1.2 V to the gate electrode 42 and application of a drain voltage of 1.2 V to the source/drain doped regions 45.

Accordingly, the gate voltage of the second MIS transistor Tr2 is lower than the gate voltage of the first MIS transistor Tr1 and higher than the gate voltage of the third MIS transistor Tr3. The drain voltage of the second MIS transistor Tr2 is lower than the drain voltage of the first MIS transistor Tr1 and the same as the drain voltage of the third MIS transistor Tr3. In the first MIS transistor Tr1, the gate voltage and the drain voltage are at the same voltage. In the second MIS transistor Tr2, the drain voltage is lower than the gate voltage. In the third MIS transistor Tr3, the gate voltage and the drain voltage are at the same voltage.

FIGS. 2A through 2C, FIGS. 3A through 3C and FIGS. 4A through 4C are cross-sectional views illustrating respective steps for fabricating a semiconductor device according to an embodiment of the present invention.

Figure 2A:
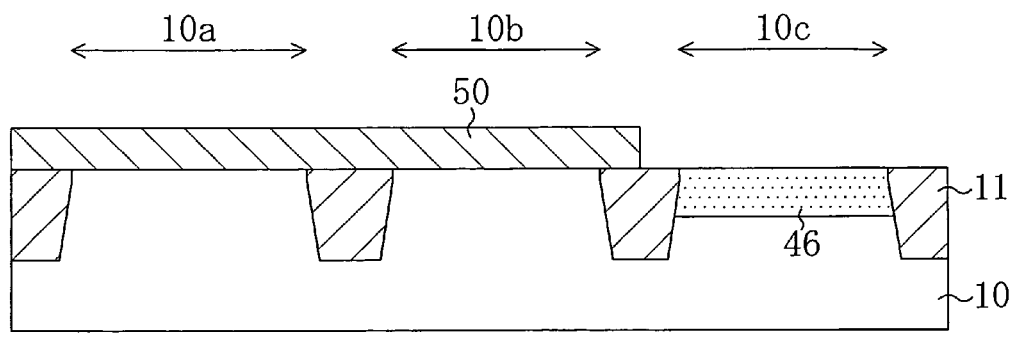
FIGS. 2A through 2C are cross-sectional views illustrating respective steps for fabricating a semiconductor device according to an embodiment of the present invention.

First, in a process step of FIG. 2A, isolation regions 11 are formed in a semiconductor substrate 10 to electrically separate a first region 10a which is to be an active region of a first MIS transistor, a second region 10b which is to be an active region of a second MIS transistor and a third region 10c which is to be an active region of a third MIS transistor from one another. Thereafter, a resist 50 is formed over the semiconductor substrate 10 so as to cover the first region 10a and the second region 10b and have an opening corresponding to the third region 10c. Then, with the resist 50 used as a mask, B ions are implanted into the third region 10c at an implantation energy of 20 keV and a dose of $1 \times 10^{13}$ ions/cm$^2$, thereby forming a threshold control layer 46. Thereafter, the resist 50 is removed.

Figure 2B:
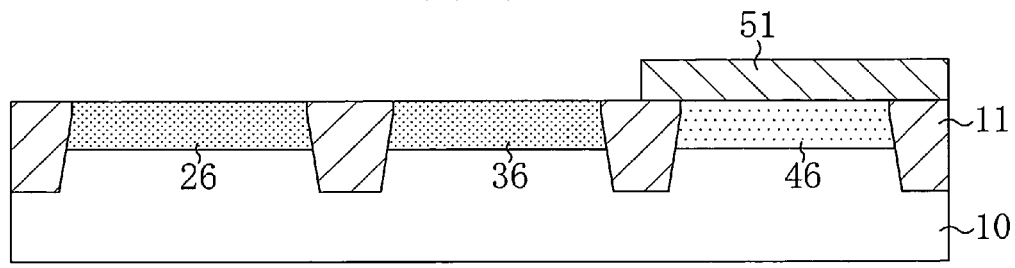

Next, in a process step of FIG. 2B, a resist 51 is formed over the semiconductor substrate 10 so as to cover the third region 10c and have an opening corresponding to the first region 10a and the second region 10b. Thereafter, with the resist 51 used as a mask, B ions are implanted into the first region 10a and the second region 10b at an implantation energy of 20 keV and a dose of $1 \times 10^{12}$ ions/cm$^2$, thereby forming a threshold control layer 26 and a threshold control layer 36. An impurity concentration in each of the threshold control layer 26 and the threshold control layer 36 is lower than an impurity concentration in the threshold control layer 46.

Figure 2C:
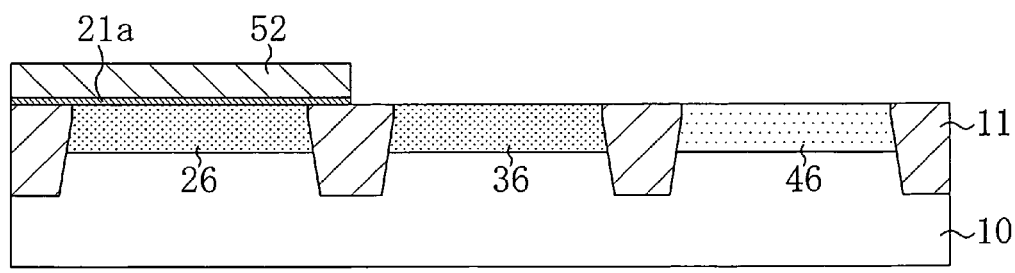

Next, in a process step of FIG. 2C, dry oxidation is performed to form a silicon oxide film over the semiconductor substrate 10 to a thickness of 5 nm. Thereafter, a resist 52 is formed over the semiconductor substrate 10 so as to cover the first region 10a and have an opening corresponding to the second region 10b and the third region 10c. Then, with the resist 52 used as a mask, the silicon oxide film is etched to have respective surfaces of the second region 10b and the third region 10c exposed and leave the silicon oxide film 21a on the first region 10a. In this process step, the silicon oxide film on the third region 10c is also removed. However, the silicon oxide film may be left also on the third region 10c so that only the surface of the second region 10b is exposed. Thereafter, the resist 52 is removed.

Figure 3A:
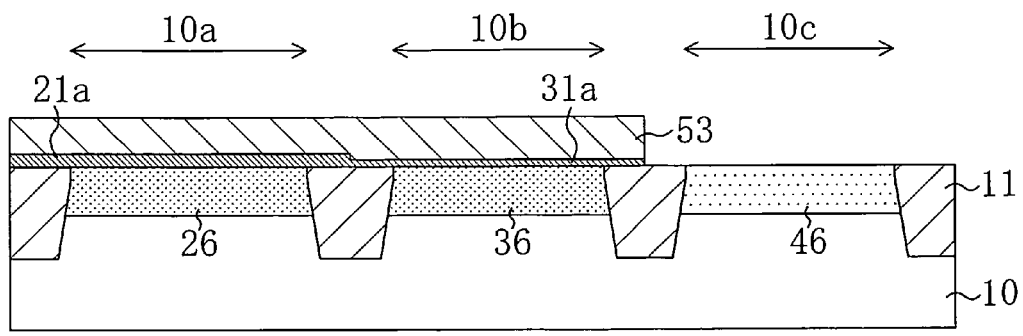
FIGS. 3A through 3C are cross-sectional views illustrating respective steps for fabricating a semiconductor device according to an embodiment of the present invention.

Next, in a process step of FIG. 3A, dry oxidation is performed to form a silicon oxide film over the semiconductor substrate 10 to a thickness of 4 nm. At this time, a thickness of the silicon oxide film 21a which has been already formed is increased on the first region 10a, and another silicon oxide film is formed on the second region 10b and the third region 10c. Thereafter, a resist 53 is formed over the semiconductor substrate 10 so as to cover the first region 10a and the second region 10b and have an opening corresponding to the third region 10c. Then, with the resist 53 used as a mask, the silicon oxide film is etched to have a surface of the third region 10c exposed and leave the silicon oxide film 21a on the first region 10a and a silicon oxide film 31a on the third region 10c. Thereafter, the resist 53 is removed.

Figure 3B:
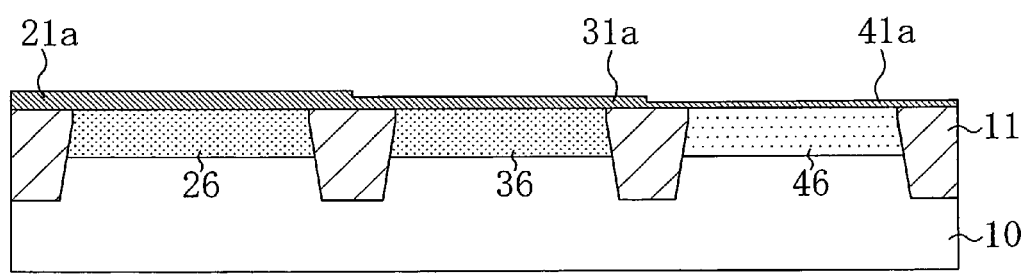

Next, in a process step of FIG. 3B, dry oxidation is performed to form a silicon oxide film over the semiconductor substrate 10 to a thickness of 2 nm. At this time, respective thicknesses of the silicon oxide films 21a and 31a which have been already formed are increased on the first region 10a and the second region 10b. Meanwhile, another silicon oxide film 41a is formed on the third region 10c. As a result of the above-described process steps, the thickness of the silicon oxide film 21a becomes 8 nm, the thickness of the silicon oxide film 31a becomes 6 nm and the thickness of the silicon oxide film 41a becomes 2 nm.

Figure 3C:
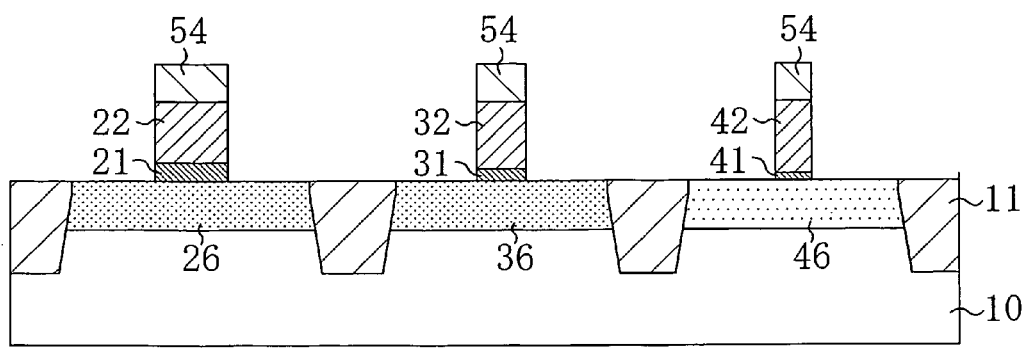

Next, in a process step of FIG. 3C, an n-type polycrystalline silicon film is deposited over the silicon oxide films 21a, 31a and 41a. Thereafter, a resist 54 having a gate pattern is formed over the polycrystalline silicon film. Subsequently, with the resist 54 used as a mask, the polycrystalline silicon film is dry etched to form a gate electrode 22 on the first region 10a, a gate electrode 32 on the second region 10b and a gate electrode 42 on the third region 10c. At this time, a gate length of the gate electrode 22 is 0.4 µm, a gate length of the gate electrode 32 is 0.1 µm and a gate length of the gate electrode 42 is 0.06 µm. Then, the resist 54 is removed. FIG. 3C shows a configuration in which, with the resist 54 remaining, the silicon oxide films 21a, 31a and 41a are etched to form gate insulating films 21, 31 and 41. However, etching of the silicon oxide films 21a, 31a and 41a may be preformed in a subsequent process step. For example, in the step of removing the resist 54 after dry etching of the polycrystalline silicon film and in the subsequent cleaning step thereto, exposed parts of the silicon oxide films 21a, 31a and 41a may be removed to form gate insulating films 21, 31 and 41.

Figure 4A:
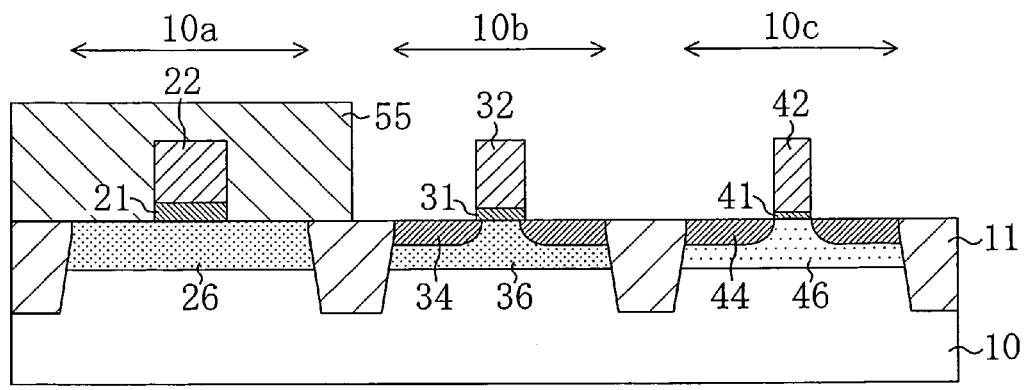
FIGS. 4A through 4C are cross-sectional views illustrating respective steps for fabricating a semiconductor device according to an embodiment of the present invention.

Next, in a process step of FIG. 4A, a resist 55 is formed over the semiconductor substrate 10 so as to cover the first region 10a and have an opening corresponding to the second region 10b and the third region 10c. Then, with the gate electrodes 32 and 42 and the resist 55 used as a mask, As ions are implanted into the second region 10b and the third region 10c at an implantation energy of 10 keV and a dose of $1 \times 10^{14}$ ions/cm$^2$. Thus, n-type LDD regions 34 are formed in the second region 10b and n-type LDD regions 44 are formed in the third region 10c. Subsequently, ion implantation of B ions is performed at an implantation energy of 30 keV and a dose of $1 \times 10^{13}$ ions/cm$^2$. Thus, a p-type pocket doped regions (not shown) are formed under the LDD regions 34 and 44. Thereafter, the resist 55 is removed.

Figure 4B:
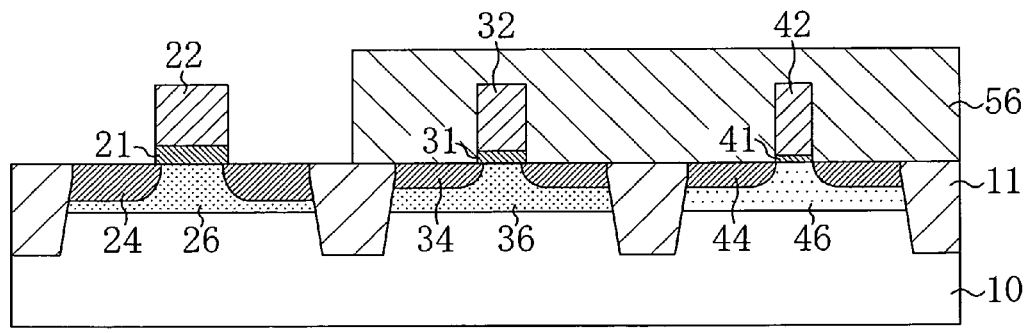

Next, in a process step of FIG. 4B, a resist 56 is formed over the semiconductor substrate 10 so as to cover the second region 10b and the third region 10c and have an opening corresponding to the first region 10a. Then, with the gate electrode 22 and the resist 56 used as a mask, P ions are implanted into the first region 10a at an implantation energy of 5 keV and a dose of $3 \times 10^{13}$ ions/cm$^2$. Thus, n-type LDD regions 24 are formed in the first region 10a. Subsequently, B ions are implanted at an implantation energy of 30 keV and a dose of $5 \times 10^{12}$ ions/cm$^2$. Thus, p-type pocket doped regions (not shown) are formed under the LDD regions 24. Thereafter, the resist 56 is removed. The LDD regions 24 are formed so as to have a higher impurity concentration than respective impurities concentration in the LDD regions 34 and 44 and also have a larger junction depth than respective junction depths of the LDD regions 34 and 44.

Figure 4C:
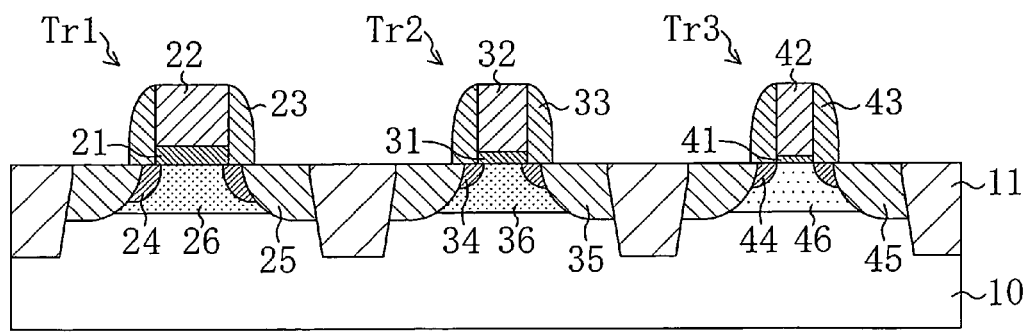

Next, in a process step of FIG. 4C, a silicon nitride film is deposited over the semiconductor substrate 10 to a thickness of 50 nm. Thereafter, the silicon nitride film is etched back to form sidewalls 23 on side surfaces of the gate electrode 22, sidewalls 33 on side surfaces of the gate electrode 32 and sidewalls 43 on side surfaces of the gate electrode 42. Then, with the gate electrodes 22, 32 and 42 and the sidewalls 23, 33 and 43 used as a mask, ion implantation of As ions is performed at an implantation energy of 20 keV and a dose of $3 \times 10^{15}$ ions/cm$^2$. Thus, n-type source/drain doped regions 25 are formed so that each of the n-type source/drain doped regions 25 is located in part of the first region 10a outwardly extending from an associated one of the sidewalls 23, n-type source/drain doped regions 35 are formed so that each of the n-type source/drain doped regions 35 is located in part of the second region 10b outwardly extending from an associated one of the sidewalls 33 and n-type source/drain doped regions 45 are formed so that each of the n-type source/drain doped regions 45 is located in part of the third region 10c outwardly extending from an associated one of the sidewalls 43. By the above-described steps, the semiconductor device including the first MIS transistor Tr1 formed in the first region 10a of the semiconductor substrate 10, the second MIS transistor Tr2 formed in the first region 10b of the semiconductor substrate 10 and the third MIS transistor Tr3 formed in the first region 10c of the semiconductor substrate 10 is obtained.

In this embodiment, an impurity concentration profile of the LDD regions 34 of the second MIS transistor Tr2 which can be used as a shared switch transistor is the same as an impurity profile of the LDD regions 44 of the third MIS transistor Tr3 which can be used as a logic transistor. Thus, even with a reduced gate length, reduction in threshold voltage can be prevented. As a result, an area of the semiconductor device can be reduced by reducing the gate length of the second MIS transistor Tr2.

Figure 5:
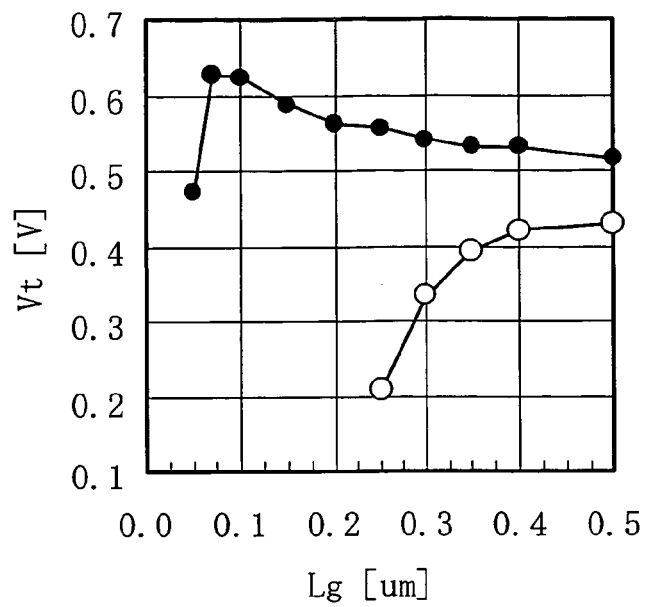
FIG. 5 is a graph showing the relationship between threshold voltage (Vt) and gate length (Lg) for MIS transistors.
Figure 6:
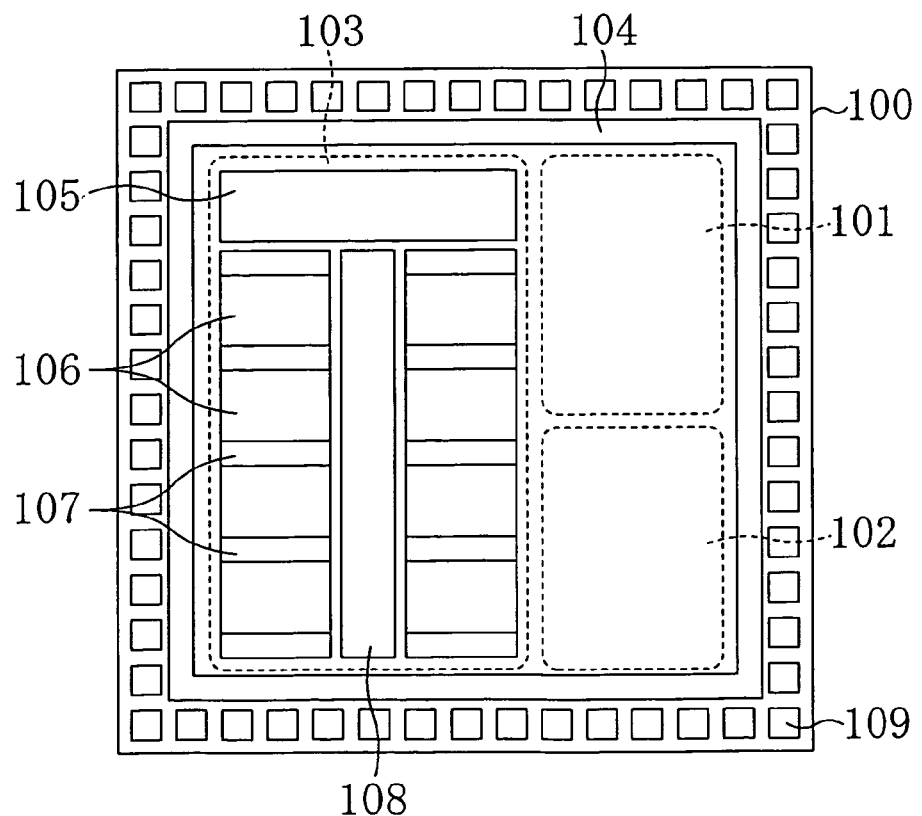
FIG. 6 is a plan view illustrating a typical DRAM embedded LSI chip.
Figure 8:
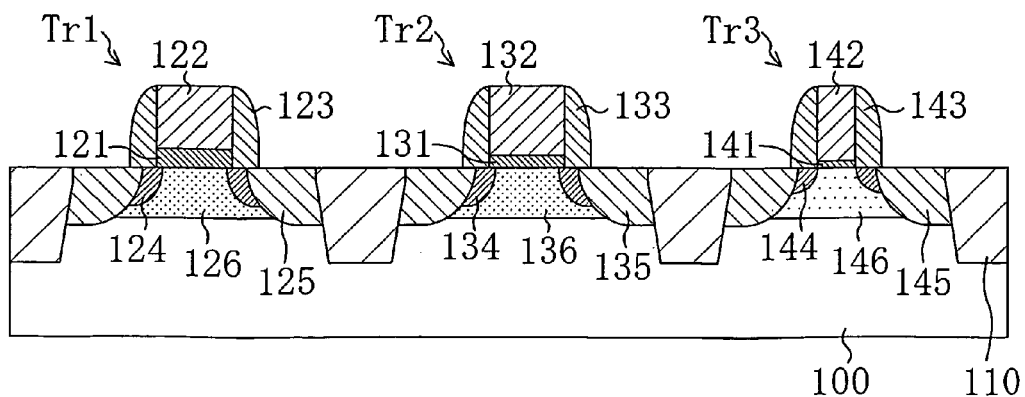
FIG. 8 is a cross-sectional view illustrating respective configurations of MIS transistors formed on regions shown in FIG. 6 and FIG. 7.
Figure 9:
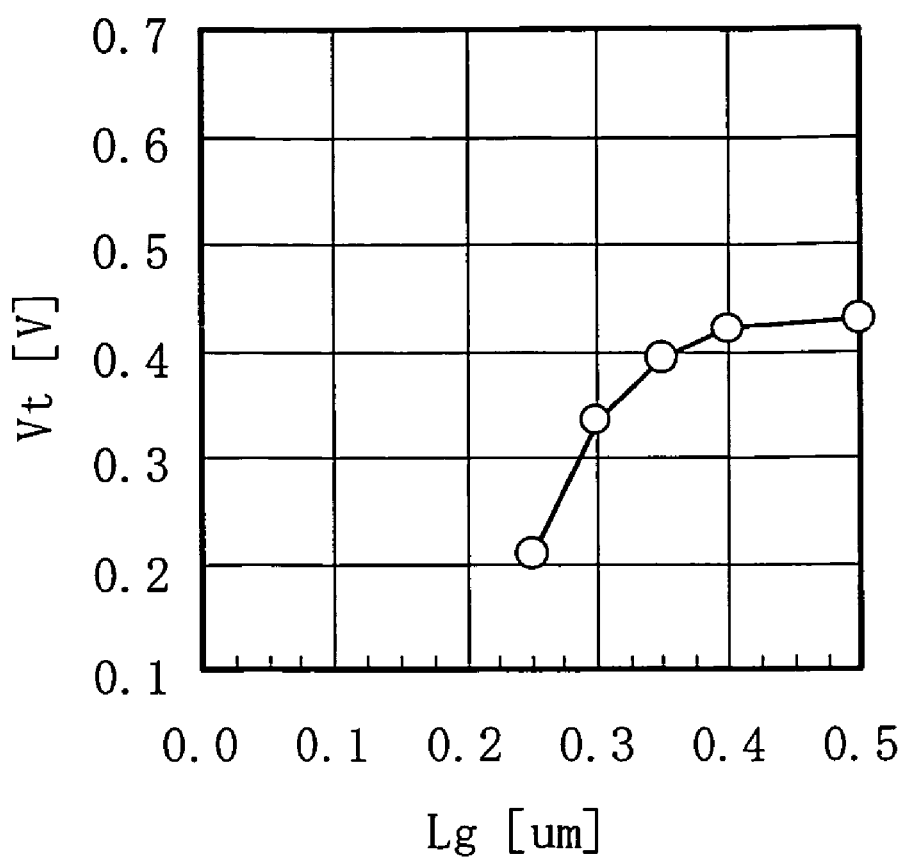
FIG. 9 is a graph showing the dependency of threshold voltage (Vt) on gate length (Lg) for the known MIS transistor.

FIG. 5 is a graph showing the relationship between threshold voltage (Vt) and gate length (Lg) for the MIS transistors. In the graph of FIG. 5, black circles indicate the dependency of threshold voltage on gate length for the second MIS transistor Tr2 (shared switch transistor) and white circles indicate the dependency of threshold voltage on gate length for the known shared switch transistor (Tr2 in FIG. 8). FIG. 5 shows that in contrast to the known shared switch transistor configuration in which when a gate length was 0.4 µm or less, a threshold voltage was reduced, a threshold voltage was not reduced even when a gate length is reduced to 0.1 µm in the configuration of the second MIS transistor Tr2 of this embodiment. In fact, in the configuration of the second MIS transistor Tr2 of this embodiment, as the gate length is reduced, the threshold voltage is increased. This result shows that a reverse short channel effect occurred.

Figure 7:
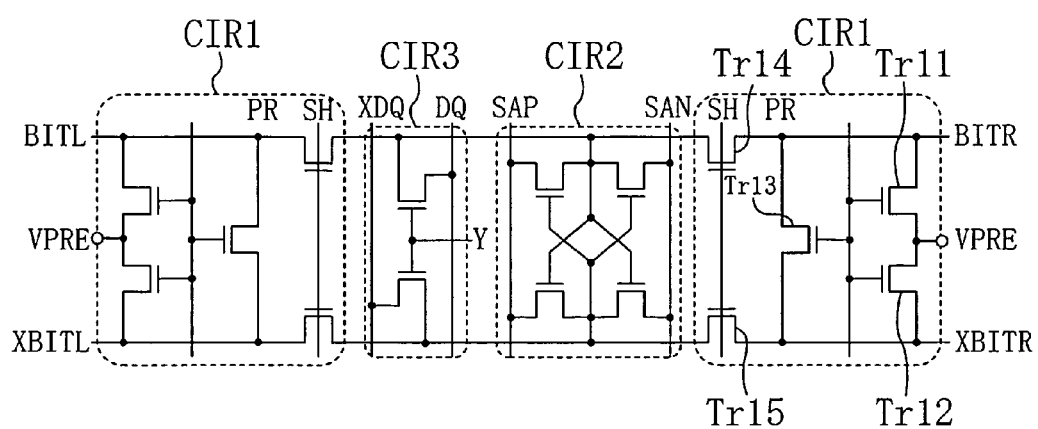
FIG. 7 is a circuit configuration of a typical sense amplifier region in a DRAM embedded LSI.

Thus, in contrast to the gate length of the known shared switch transistor (Tr2 of FIG. 8) being 0.40 µm, the gate length of the second MIS transistor Tr2 of this embodiment can be made to be 0.1 µm. As a result, for example, when the second MIS transistor Tr2 of this embodiment is applied to the shared switch circuit portion including the shared transistors Tr14 and Tr15 in each of the sense amplifiers of FIG. 7, a width of the shared switch circuit portion in the gate length direction can be made from 1.42 µm in the known device to 0.82 µm, so that 43% reduction in the width can be achieved. In this embodiment, the LDD regions 34 of the second MIS transistor Tr2 can be formed in the same process step of forming the LDD regions 44 of the third MIS transistor Tr3, so that the area of the semiconductor device can be reduced without increasing the number of process steps and fabrication costs, compared to the known technique.

In this embodiment, the case where the first MIS transistor Tr1 is used for an I/O transistor, the second MIS transistor Tr2 is used for a shared switch transistor and the third MIS transistor Tr3 is used for a logic transistor has been described. However, use of the MIS transistors Tr1, Tr2 and Tr3 is not limited to such cases but may be applied to transistors used for some other application purpose. For example, for the second MIS transistor Tr2, not only as a shared switch transistor but also as a percharge transistor or an equalizing transistor may be used. A shared transistor, a precharge transistor and an equalizing transistor are formed in regions close to one another, respectively. Therefore, if those transistors are formed under the same conditions, process steps can be simplified.

In this embodiment, the LDD regions 24, the LDD regions 34 and the LDD regions 44 are formed in the first MIS transistor Tr1, the second MIS transistor Tr2 and the third MIS transistor Tr3, respectively. However, instead of formation of the LDD regions 24, 34 and 44 in such arrangement, an SD extension doped layer may be formed.

In this embodiment, the case where the n-types MIS transistors are formed has been described. However, p-channel MIS transistors may be formed.

What is claimed is:

1. A semiconductor device comprising:
    a first MIS transistor formed in a first region of a semiconductor substrate;
    a second MIS transistor formed in a second region of the semiconductor substrate; and
    a third MIS transistor formed in a third region of the semiconductor substrate,
    wherein the first MIS transistor includes a first gate insulating film formed on the first region, a first gate electrode formed on the first gate insulating film, a first impurity doped layer formed in part of the first region located at each side of the first gate electrode and a first threshold control layer formed in part of the first region located under the first gate electrode,
    wherein the second MIS transistor includes a second gate insulating film formed on the second region, a second gate electrode formed on the second gate insulating film, a second impurity doped layer formed in part of the second region located at each side of the second gate electrode and a second threshold control layer formed in part of the second region located under the second gate electrode,
    wherein the third MIS transistor includes a third gate insulating film formed on the third region, a third gate electrode formed on the third gate insulating film, a third impurity doped layer formed in part of the third region located at each side of the third gate electrode and a third threshold control layer formed in part of the third region located under the third gate electrode,
    wherein a thickness of the second gate insulating film is substantially the same as or smaller than a thickness of the first gate insulating film and is larger than a thickness of the third gate insulating film,
    wherein the second impurity doped layer has substantially the same impurity concentration profile as an impurity concentration profile of the third impurity doped layer and has a lower impurity concentration than an impurity concentration of the first impurity doped layer, and
    wherein the second threshold control layer has substantially the same impurity concentration profile as an impurity concentration profile of the first threshold control layer and has a lower impurity concentration than an impurity concentration of the third threshold control layer.

2. The semiconductor device of claim 1, wherein the first MIS transistor further includes first sidewalls on side surfaces of the first gate electrode, respectively, and first source/drain regions formed so that each said first source/drain doped region is located in part of the first region outwardly extending from an associated one of the first sidewalls,
    wherein the second MIS transistor further includes second sidewalls on side surfaces of the second gate electrode, respectively, and second source/drain regions formed so that each said second source/drain doped region is located in part of the second region outwardly extending from an associated one of the second sidewalls, and
    wherein the third MIS transistor further includes third sidewalls on side surfaces of the third gate electrode, respectively, and third source/drain regions formed so that each said third source/drain doped region is located in part of the third region outwardly extending from an associated one of the third sidewalls.

3. The semiconductor device of claim 2, wherein the first sidewalls are formed of a silicon nitride film, a silicon oxide film or a laminated film of a silicon nitride film and a silicon oxide film.

4. The semiconductor device of claim 2, wherein the second sidewalls are formed of a silicon nitride film, a silicon oxide film or a laminated film of a silicon nitride film and a silicon oxide film.

5. The semiconductor device of claim 2, wherein the third sidewalls arc formed of a silicon nitride film, a silicon oxide film or a laminated film of a silicon nitride film and a silicon oxide film.

6. The semiconductor device of claim 2, wherein the first source/drain regions include As ions.

7. The semiconductor device of claim 2, wherein the second source/drain regions include As ions.

8. The semiconductor device of claim 2, wherein the third source/drain regions include As ions.

9. The semiconductor device of claim 1, wherein each of the first impurity doped layer, the second impurity doped layer and the third impurity doped layer is a LDD region.

10. The semiconductor device of claim 1, wherein a junction depth of the first impurity doped layer is larger than respective junction depths of the second impurity doped layer and the third impurity doped layer.

11. The semiconductor device of claim 1, wherein the second impurity doped layer and the third impurity doped layer are formed by the same ion implantation.

12. The semiconductor device of claim 1, wherein the first threshold control layer and the second threshold control layer are formed by the same ion implantation.

13. The semiconductor device of claim 1, further comprising:
    a memory cell; and
    a sense amplifier,
    wherein the second MIS transistor is a shared switch transistor located between the memory cell and the sense amplifier.

14. The semiconductor device of claim 1, further comprising:
    a memory cell; and
    a sense amplifier,
    wherein the second MIS transistor is a precharge transistor located between the memory cell and the sense amplifier.

15. The semiconductor device of claim 1, further comprising:
    a memory cell; and
    a sense amplifier, wherein the second MIS transistor is an equalizing transistor located between the memory cell and the sense amplifier.

16. The semiconductor device of claim 1, wherein the first MIS transistor is an input/output transistor.

17. The semiconductor device of claim 1, wherein the third MIS transistor is a logic transistor.

18. The semiconductor device of claim 1, wherein a gate length of the second gate electrode is smaller than a gate length of the first gate electrode and larger than a gate length of the third gate electrode.

19. The semiconductor device of claim 1, wherein the semiconductor substrate is a p-type semiconductor substrate made of silicon.

20. The semiconductor device of claim 1, wherein the first gate insulating film is formed of a silicon oxide film.

21. The semiconductor device of claim 1, wherein the first gate electrode is formed of polysilicon.

22. The semiconductor device of claim 1, wherein the second gate insulating film is formed of a silicon oxide film.

23. The semiconductor device of claim 1, wherein the second gate electrode is formed of polysilicon.

24. The semiconductor device of claim 1, wherein the third gate insulating film is formed of a silicon oxide film.

25. The semiconductor device of claim 1, wherein the third gate electrode is formed of polysilicon.

26. The semiconductor device of claim 1, wherein a gate voltage of the second MIS transistor is lower than a gate voltage of the first MIS transistor and higher than a gate voltage of the third MIS transistor.

27. The semiconductor device of claim 1, wherein a drain voltage of the second MIS transistor is lower than a drain voltage of the first MIS transistor and the same as a drain voltage of the third MIS transistor.

28. The semiconductor device of claim 1, wherein in the first MIS transistor, the gate voltage and the drain voltage are the same voltage.

29. The semiconductor device of claim 1, wherein in the second MIS transistor, the drain voltage is lower than the gate voltage.

30. The semiconductor device of claim 1, wherein in the third MIS transistor, the gate voltage and the drain voltage are the same voltage.

31. The semiconductor device of claim 1, wherein the third threshold control layer includes B ions.

32. The semiconductor device of claim 1, wherein the second threshold control layer includes B ions.

33. The semiconductor device of claim 1, wherein the second impurity doped layer includes As ions.

34. The semiconductor device of claim 1, wherein the third impurity doped layer includes As ions.

35. The semiconductor device of claim 1, wherein the first impurity doped layer includes P ions.

* * * * *